US008773863B2

(12) United States Patent
Ikeda

(10) Patent No.: US 8,773,863 B2
(45) Date of Patent: Jul. 8, 2014

(54) TERMINAL MOUNTING CONSTRUCTION AND ELECTRONIC DEVICE

(75) Inventor: Takayuki Ikeda, Makinohara (JP)

(73) Assignee: Yazaki Corporation, Tokyo (JP)

( * ) Notice: Subject to any disclaimer, the term of this patent is extended or adjusted under 35 U.S.C. 154(b) by 162 days.

(21) Appl. No.: 13/358,841

(22) Filed: Jan. 26, 2012

(65) Prior Publication Data

US 2012/0195014 A1 Aug. 2, 2012

(30) Foreign Application Priority Data

Jan. 28, 2011 (JP) ................................ 2011-015982

(51) Int. Cl.
*H05K 5/00* (2006.01)

(52) U.S. Cl.
USPC ............................ 361/730; 361/728; 361/801

(58) Field of Classification Search
CPC ...... H01R 23/70; B41J 2/17526; H01M 2/30; G06K 13/085; G06K 13/0856; G06K 13/0887; H05K 7/1069; H05K 1/117; H05K 2201/09081; H05K 3/3442; H05K 3/365; H05K 5/0069; G06F 1/1633; G06F 1/16
USPC ......... 361/728–730, 747, 752, 758, 759, 796, 361/800–802; 439/76.1, 76.2, 78, 487, 701, 439/949
See application file for complete search history.

(56) References Cited

U.S. PATENT DOCUMENTS 5,087,611 A * 2/1992 Forrest .......................... 507/104
6,540,523 B1 * 4/2003 Kung et al. ..................... 439/64
6,657,869 B1 * 12/2003 Linke et al. ................... 361/752
6,685,501 B1 2/2004 Wu et al.
6,716,057 B1 * 4/2004 Wu ............................... 439/497
6,850,412 B2 * 2/2005 Peter ............................ 361/736
2010/0226140 A1 9/2010 Mochizuki
2012/0196457 A1 * 8/2012 Ikeda ............................ 439/78

FOREIGN PATENT DOCUMENTS

JP 02007374 A 1/1990
JP 02119073 A 5/1990
JP 2010212322 A 9/2010

OTHER PUBLICATIONS

Office Action dated Dec. 24, 2013, issued by the State Intellectual Property Office of the People's Republic of China in counterpart Chinese Application No. 201210021575.2.

* cited by examiner

*Primary Examiner* — Hung S Bui
(74) *Attorney, Agent, or Firm* — Sughrue Mion, PLLC

(57) ABSTRACT

A terminal mounting construction includes a housing and a terminal. The housing accommodates a substrate and including a locking portion. The terminal connects the substrate to an electric wire. The terminal includes a conductive portion, a substrate connecting terminal portion, a wire connecting portion and a locked portion. The conductive portion is connected to a pattern on the substrate. The substrate connecting terminal portion holds the substrate together with the conductive portion. The wire connecting portion is connected to the electric wire from an opposite direction to an inserting direction in which the substrate is inserted between the conductive portion and the substrate connecting terminal portion. The locked portion is locked in the locking portion. The housing includes an accommodating portion accommodating the substrate connecting terminal portion so as to receive an end face of the substrate connecting terminal portion which faces to follow the opposite direction.

4 Claims, 6 Drawing Sheets

TERMINAL MOUNTING CONSTRUCTION AND ELECTRONIC DEVICE

BACKGROUND

The present invention relates to a terminal mounting construction for connecting a substrate accommodated in a housing to electric wires and an electronic device that includes the terminal mounting construction.

As Patent Documents 1 and 2 below disclose, patterns and electronic components on a substrate are connected to exterior components by terminals. In terminals disclosed in Patent Documents 1 and 2, a substrate is held in a thickness direction by a pair of holding pieces provided at one end thereof, and the terminal is connected to a pattern on the substrate by one of the pair of holding pieces. In the terminals of this type, the other end is connected through press fitting or connected by a connector to a wiring, and as this occurs, there are fears that a load is generated in a connecting portion between the substrate and the terminal by an impact generated when the terminal is so connected to the wiring.

Because of this, in a bus bar disclosed in Patent Document 3 below, in order to prevent the transmission of an impact generated when connected to a wiring to an LED mounting portion where an LED is mounted, an impact absorbing portion is provided between an electric wire connecting portion and the LED mounting portion by bending out a portion extending therebetween at right angles or into a crank shape. In the bus bar, press-fit cutting blades are provided in one main surface of a wiring connecting portion which extends parallel to an LED mounting surface, whereby a wiring is electrically connected to the bus bar by the press-fit cutting blades.

In Patent Document 3, the bus bar is formed integrally with the housing, and the wiring is connected to the press-fit cutting blades which extend from the one main surface of the wiring connecting portion. Thus, there have been fears that an increase in height of the wiring accommodation space is called for.

[Patent Document 1] JP-A-2-119073

[Patent Document 2] JP-A-2-7374

[Patent Document 3] JP-A-2010-212322

SUMMARY

It is therefore one advantageous aspect of the present invention to provide a terminal mounting construction which can solve the problem and an electronic device that includes the terminal mounting construction.

According to one advantage of the invention, there is provided a terminal mounting construction, comprising;

a housing configured to accommodate a substrate and including a locking portion;

a terminal configured to connect the substrate accommodated in the housing to an electric wire, wherein the terminal includes:

a conductive portion configured to be connected to a pattern on the substrate;

a substrate connecting terminal portion configured to hold the substrate together with the conductive portion in a state where the substrate is inserted between the conductive portion and the substrate connecting terminal portion;

a wire connecting portion configured to be connected to the electric wire from an opposite direction to an inserting direction in which the substrate is inserted between the conductive portion and the substrate connecting terminal portion; and a locked portion configured to be locked in the locking portion, and wherein the housing includes an accommodating portion configured to accommodate the substrate connecting terminal portion so as to receive an end face of the substrate connecting terminal portion which faces to follow the opposite direction.

The locking portion may include at least one of a groove and hole formed in the housing, and the locked portion may include a projection to be inserted into at least one of the groove and the hole.

The terminal mounting construction may be configured such that: a plurality of terminals like the terminal are aligned so that inserting directions of the substrate for each of the terminals are same direction, and the housing includes a guide portion configured to guide the substrate to be inserted into the housing.

According to another advantage of the invention, there is provided an electronic device, comprising:

a housing accommodating a substrate;

a cover accommodating the housing and including a locking portion;

a holder, configured to hold a plurality of electric wires which are to be connected to the substrate, and mounted in an opening portion at one end of the cover; and a plurality of terminals, disposed to align along the opening portion at the one end of the cover, configured to connect the electric wires to the substrate, wherein each of the terminals includes:

a conductive portion connected to a pattern on the substrate;

a substrate connecting terminal portion holding the substrate together with the conductive portion in a state where the substrate is inserted between the conductive portion and the substrate connecting terminal portion;

a wire connecting portion configured to be respectively connected to the electric wires from an opposite direction to an inserting direction in which the substrate is inserted between the conductive portion and the substrate connecting terminal portion; and a locked portion locked in the locking portion, wherein the wire connecting portion oriented towards an outside of the opening portion at the one end, and wherein the holder is brought into engagement with the cover by an engagement portion.

BRIEF DESCRIPTION OF DRAWINGS

FIGS. 4A and 4B show drawings depicting a terminal, of which FIG. 4A is a perspective of the terminal as viewed from thereabove, and FIG. 4B is a perspective view of the terminal as viewed from therebelow.

DETAILED DESCRIPTION OF EXEMPLIFIED EMBODIMENTS

Figure 1:
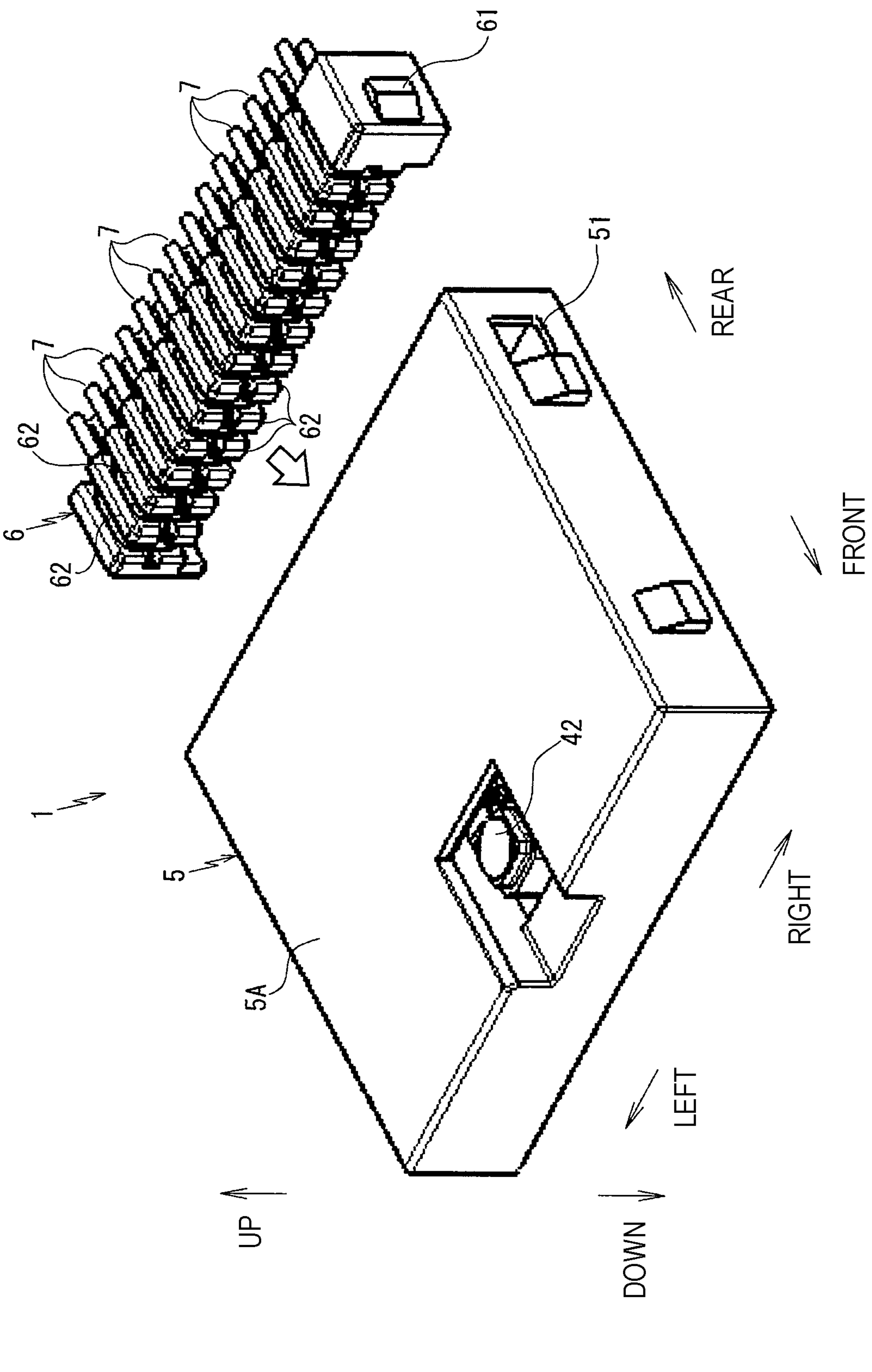
FIG. 1 is a perspective view of an electronic device according to one embodiment of the invention.

Hereinafter, referring to the drawings, an embodiment of the invention will be described.

Upward and downward directions, forward and rearward directions and leftward and rightward directions which are used to describe the embodiment are shown in the individual drawings. These directions are shown for the purpose of describing the embodiment, and hence, they may, of course, be different from actual arrangements.

Figure 2:
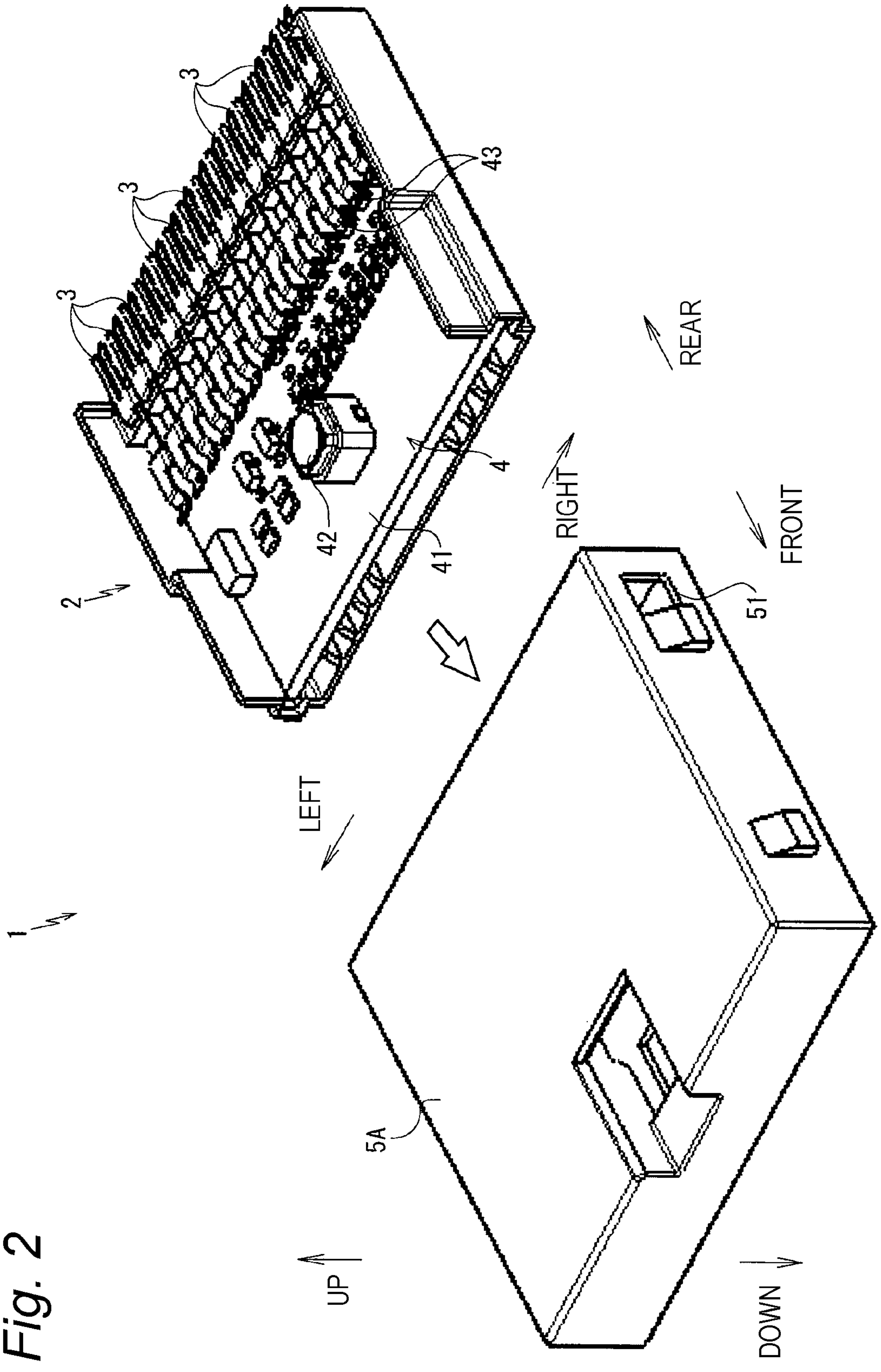
FIG. 2 is an exploded perspective view of a device main body included in the electronic device shown in FIG. 1.

An electronic device 1 shown in FIG. 1 includes a device main body 5 which incorporates electronic components and a holder 6 which holds electric wires 7 which are connected to the device main body 5. As FIG. 2 shows, in the device main body 5, a substrate 4 and terminals 3 which are connected to patterns on the substrate 4 are mounted in a housing 2, and the housing 2 is inserted into a cover 5A as indicated by a thick arrow in FIG. 2 for accommodation in the cover 5A. The cover 5A has a quadrangular parallelepiped box shape which is opened in a rear side, and an engagement hole 51 is formed in each of left and right lateral sides thereof.

As FIG. 1 shows, in the holder 6, electric wires 7 are accommodated between a plurality of holding portions 62 which are aligned in a transverse direction, and an engagement projecting portion 61 is provided on each of left and right lateral sides of the holder 6 for engagement with the corresponding engagement hole 51 in the cover 5A. As indicated by a thick arrow shown in FIG. 1, when the holder 6 is mounted in an opening portion at a rear end of the cover 5A, the engagement projections 61 are brought into engagement with the corresponding engagement holes 51, whereby the holder 6 is locked in the device main body 5. In other words, the holder 6 is brought into engagement with the cover 5A by an engagement portion including the engagement projections 61 and the engagement holes 51.

Figure 3A:
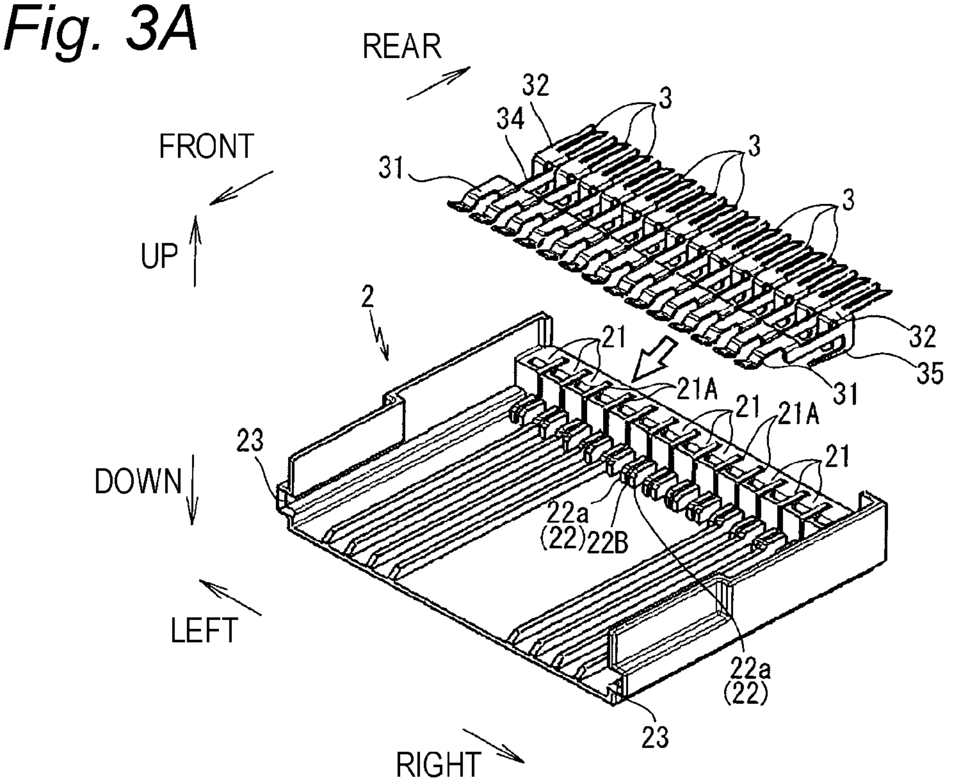
FIGS. 3A and 3B show drawings depicting assembling methods of assembling terminals and a substrate to a housing included in the device main body.

As FIG. 3A shows, the housing 2 includes terminal mounting portions 21 in which the terminals 3 are mounted, accommodation members 22 which accommodate substrate connecting terminal portions 34 of the terminals and guide recess portions 23 which guide the substrate 4. The terminal mounting portions 21 are arranged in the transverse direction with accommodation grooves 21A provided between the adjacent terminal mounting portions 21. Then, the terminals 3 are mounted individually in the terminal mounting portions 21 from thereabove as indicated by a thick arrow shown in FIG. 3A. Each accommodation member 22 includes a pair of accommodation tongue pieces 22*a* which is disposed so as to define accommodation grooves 21A between adjacent accommodation tongue pieces 22*a* or an accommodation tongue piece 22*a* and a right lateral side plate of the housing 2. The guide recess portions 23 are formed into recess portions which can guide both sides of the substrate 4.

Figure 3B:
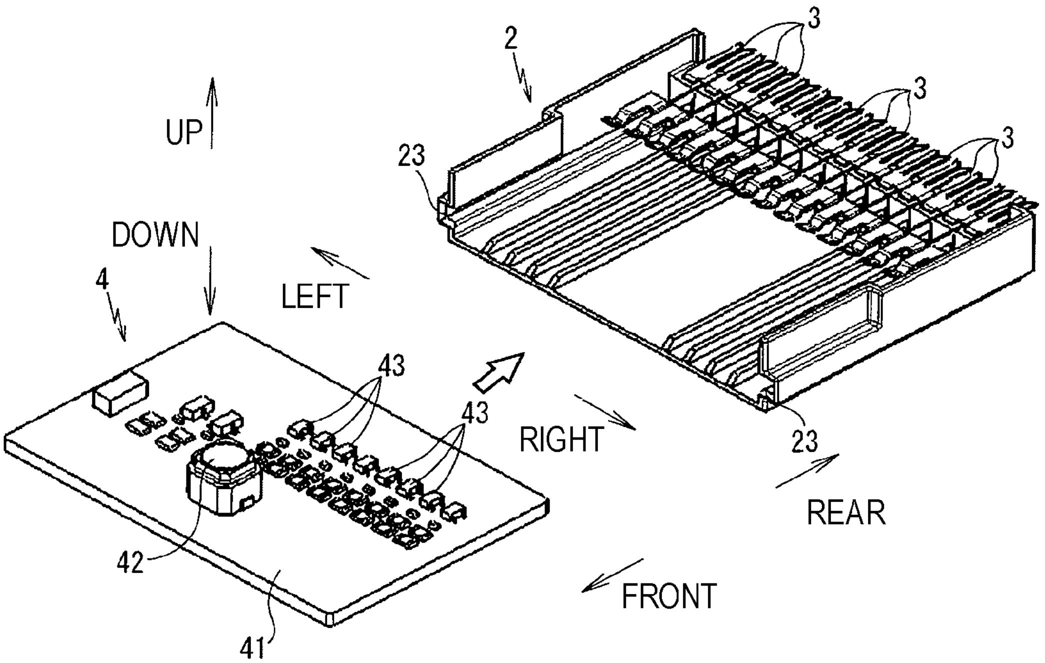

As FIG. 3B shows, the substrate 4 includes electronic components such as switches 42 and power transistors 43 which are provided on an upper side of a substrate main body 41 on which patterns are formed. The power transistors 43 are aligned in the transverse direction at equal intervals on the upper side of the substrate main body 41. The substrate 4 is inserted into an opening portion at a front end of the housing 2 as indicated by a thick arrow shown in FIG. 3B for connection with the substrate connecting terminal portions 34 of the terminals 3 mounted in the terminal mounting portions 21.

Figure 4A:
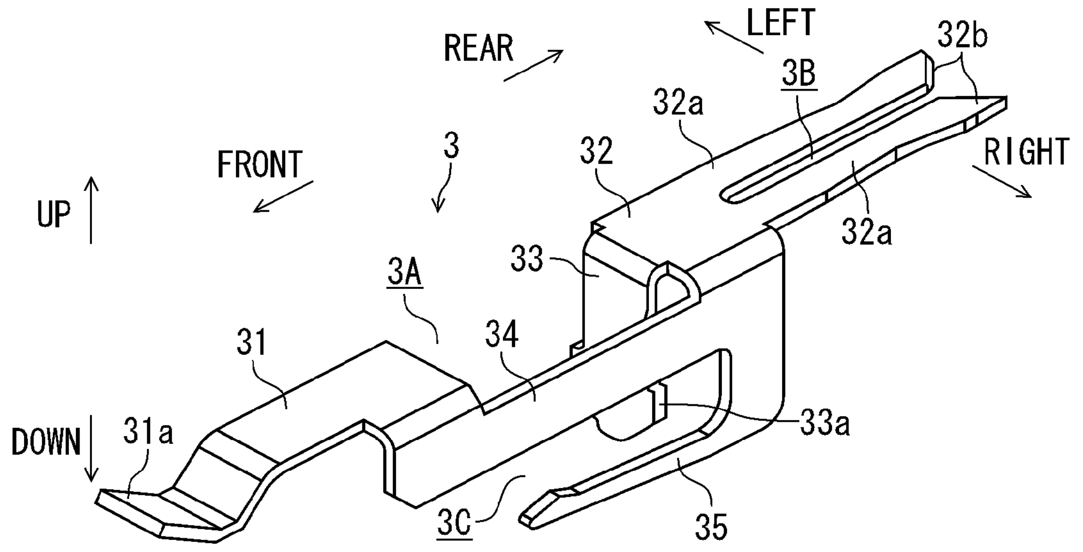
Figure 4B:
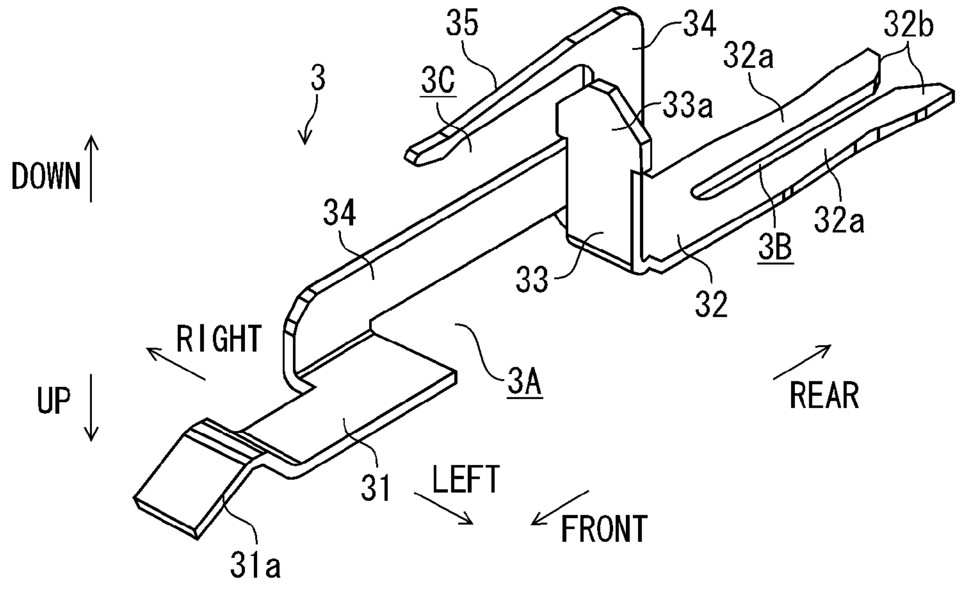

FIG. 4A is a perspective view of the terminal as viewed from thereabove, and FIG. 4B is a perspective view of the terminal as viewed from therebelow. As FIGS. 4A and 4B show, the terminal 3 includes a heat-generating element contact portion 31 which has a flat plate-like shape and which extends in a longitudinal direction, a wire connecting portion 32 which extends in the longitudinal direction with a space 3A defined between the heat-generating element contact portion 31 and itself, a locked portion 33 which has a flat plate-like shape and which extends downwards from a front edge of the wire connecting portion 32, and the substrate connecting terminal portion 34 which extends downwards from a right edge of a rear end portion of the heat-generating element contact portion 31 and a right edge of a front end portion of the wire connecting portion 32 so as to connect the heat-generating element contact portion 31 with the wire connecting portion 32.

A contact portion 31*a* is provided at a front end portion of the heat-generating element contact portion 31. This contact portion 31*a* is formed by curving part of the heat-generating element contact portion 31 downwards into a V-like shape. Connecting portions 32*a* are provided at a rear end portion of the wire connecting portion 32. These connecting portions 32*a* are disposed side by side with a space 3B defined therebetween and extend rearwards in a flat plate-like fashion. Guide portions 32*b* are provided at respective rear end portions of both the connecting portions 32*a* by expanding the space 3B in the transverse direction. A wider portion 33*a* is provided at a lower end portion of the locked portion 33 by widening the width of the lower end portion of the locked portion 33. A lower end portion of the wider portion 33*a* is tapered gradually towards a lower end thereof.

An conductive portion 35 extends from a lower edge of a rear end portion of the substrate connecting terminal portion 34 into an L-like shape with a space 3C defined with the substrate connecting terminal portion 34. The conductive portion 35 extends downwards from the lower edge of the substrate connecting terminal portion 34 while being formed into a rectangular flat plate-like shape and thereafter extends forwards while gradually reducing a vertical width. An engagement portion which swells upwards is provided at a front end portion of the conductive portion 35.

Figure 5:
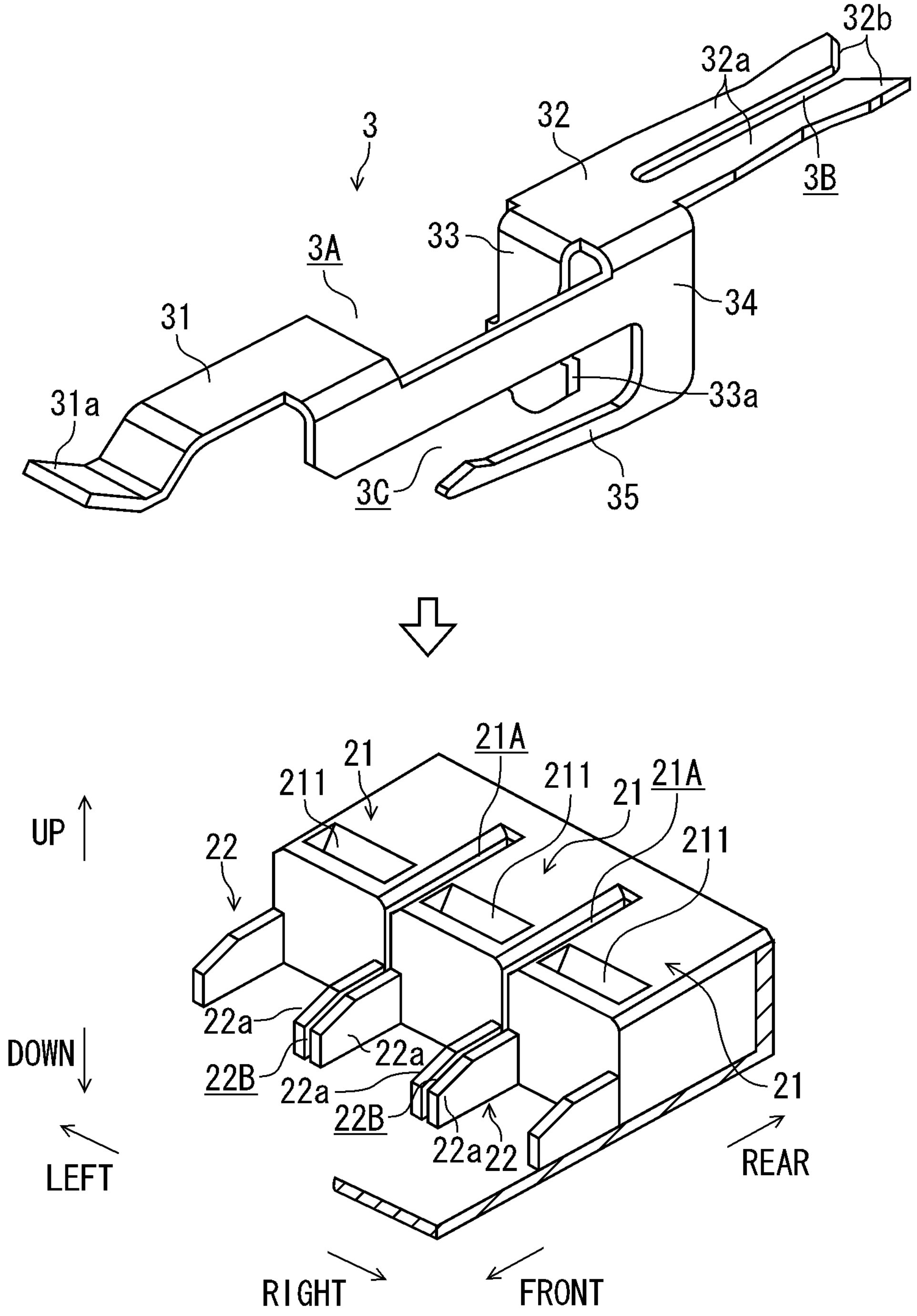
FIG. 5 is a drawing depicting the configuration of a terminal mounting portion included in the housing and an assembling method of a terminal into the terminal mounting portion.

The terminal 3 is mounted in the terminal mounting portion 21 from thereabove as indicated by a thick arrow in a posture shown in FIG. 5. As FIG. 5 shows, the terminal mounting portion 21 extends forwards from a rear side plate of the housing 2 while being formed into the shape of a quadrangular parallelepiped block. A locking hole 211 is opened in an upper side of a front end portion of the terminal mounting portion 21. An opening portion at an upper end of the locking hole 211 is formed so that a longitudinal width is gradually increased towards the upper end of the hole.

The accommodation tongue pieces 22*a* which make up the accommodation member 22 extend forwards from left and right edge portions of a front end face of the terminal mounting portion 21. Each accommodation tongue piece 22*a* extends forwards with a left or right lateral side oriented towards the accommodation groove 21A made flush with a left or right lateral side of the terminal mounting portion 21 which is oriented in the same direction. An upper side of a front end portion of the accommodation tongue piece 22*a* is inclined downwards gradually from a rear end towards a front end. The adjacent accommodation members 22 define accommodation grooves 22B which communicate with the accommodation grooves 21A and which extend in the longitudinal direction.

Figure 6:
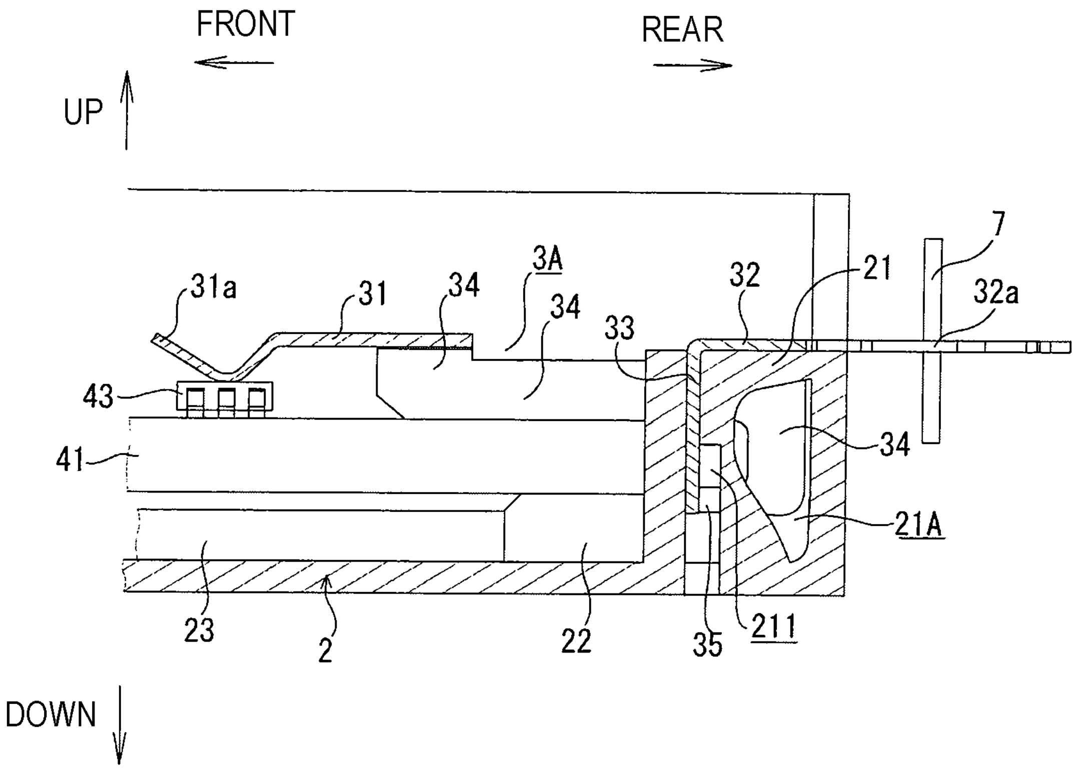
FIG. 6 is a drawing depicting a connecting method of connecting the substrate and an electric wire and the terminal.

In the terminal 3 mounted in the terminal mounting portion 21, as FIG. 6 shows, the wire connecting portion 32 is placed on an upper side of the terminal mounting portion 21, and the heat-generating element connecting portion 31 extends forwards, while the connecting portions 32*a* extend rearwards. The looked portion 33 is inserted into an interior of the locking hole 211, and the wider portion 33*a* is locked on left and right lateral walls of the locking hole 211. The rear end portion of the substrate connecting terminal portion 34 is accommodated in the accommodation groove 21A. The conductive portion 35 is accommodated in the accommodation groove 21A and the accommodation groove 22B with the engagement portion thereof positioned above the accommodation member 22.

As FIG. 6 shows, when the substrate 4 is inserted between the substrate connecting terminal portion 34 and the conductive portion 35, the engagement portion of the conductive portion 35 which is positioned above the accommodation member 22 is brought into abutment with the substrate 4 to thereby deflect the conductive portion 35 downwards, whereby the substrate 4 is held by the substrate connecting terminal portion 34 and the conductive portion 35. Additionally, the power transistor 43 on the substrate 4 is brought into abutment with the contact portion 31*a* which is positioned forwards of the substrate connecting terminal portion 34 to thereby deflect the heat-generating element contact portion 31 upwards, whereby the power transistor 43 is held between the substrate main body 41 and the heat-generating element contact portion 31. In addition, when the electric wire 7 is inserted into the space 3B defined between the connecting portions 32*a* as the holder 6 is mounted in the cover 5A, a covering of the electric wire 7 is cut off by both the connecting portions 32*a*. Then, a conductor placed in the center of the electric wire 7 is brought into contact with the connecting portions 32*a* to thereby be held therebetween, whereby the terminal 3 and the electric wire 7 are electrically connected together.

When the substrate 4 is inserted into and removed from between the substrate connecting terminal portion 34 and the conductive portion 35 and the electric wire 7 is inserted into and removed from between the connecting portions 32*a*, the terminal 3 is pushed rearwards or forwards by the substrate 4 or the electric wire 7. However, the locked portion 33 is locked in the locking hole 211, and therefore, the terminal 3 is restricted from moving forwards and rearwards. Additionally, front and rear sides of the locked portion 33 are brought into abutment with front and rear inner sides of the locking hole 211, and therefore, the terminal 3 is restricted from moving forwards and rearwards. A rear edge portion of the substrate connecting terminal portion 34 is brought into abutment with a rear inner side of the accommodation groove 21A, and therefore, the terminal 3 is restricted from moving rearwards. Thus, the forward and rearward movements of the terminal 3 that result when the terminal 3 is pressed by the substrate 4 or the electric wire 7 are restricted in a more ensured fashion.

According to the embodiment of the invention, by bringing the heat-generating element contact portion 31 into contact with the power transistor 43 mounted on the substrate 4, heat generated by the power transistor 43 can be dissipated by way of the terminal 3 and the electric wire 7. This can promote the dissipation of heat generated in the heating portion with providing no heat sink.

According to the embodiment, by locking the wider portion 33*a* of the looked portion 33 in the locking hole 211 in the housing 2, the terminal 3 is restricted from moving when the substrate 4 and the electric wire 7 are attached to and detached from the terminal 3, thereby making it possible to reduce the load applied to the connecting portions between the substrate 4 and the electric wire 7 and the terminal 3.

According to the embodiment, the forward and rearward movements of the locked portion 33 are restricted by the locking hole 211, and the rearward movement of the substrate connecting terminal portion 34 is restricted by the accommodation groove 21A. Therefore, it is possible to reduce the load applied to the connecting portions between the substrate 4 and the electric wire 7 and the terminal 3 when the substrate 4 and the electric terminal 7 are press fitted in the terminal 3. Moreover, the electric wire 7 is held between the pair of connecting portions 32*a* which extend rearwards so as to be connected to the terminal 3 from the opposite direction to the direction in which the substrate 4 is connected to the terminal 3. Therefore, it is possible to reduce the accommodation space for the substrate 4 and the electric wire 7 which are connected to the terminal 3. As a result, the electronic device 1 can be made compact in size.

According to the embodiment, the substrate 4 is guided by the guide recess portions 23 so as to be inserted into the housing 2 and is then connected to the plurality of terminals 3 at one time. Therefore, the attachment and detachment of the substrate 4 to and from the terminals 3 can be facilitated.

According to the embodiment, the heat-generating element contact portion 31 extends from the substrate connecting terminal portion 34 which holds the substrate 4 together with the conductive portion 35. Therefore, the contact portion 31*a* of the heat-generating element contact portion 31 can be pressed against the power transistor 43 in an ensured fashion, thereby making it possible to ensure the dissipation of heat from the power transistor 43.

In the embodiment, while the terminal 3 is described as being mounted in the housing 2 by locking the locked portion 33 of the terminal 3 in the locking hole 211 in the housing 2, a configuration may be adopted in which the locked portion of the terminal 3 is locked in a locking portion provided in the cover 5A so that the terminal 3 is mounted in the cover 5A.

According to this configuration, too, the forward and rearward movements of the terminal 3 are restricted by the locking portion, and the rearward movement of the conductive portion 35 is restricted by the accommodation groove 21A. Therefore, it is possible to reduce the load applied to the connecting portions of the substrate 4 and the electric wire 7 and the terminal 3 when the substrate 4 and the electric wire 7 are connected to the terminal 3. In addition, it is possible to reduce the height of the accommodation space for the substrate 4 and the electric wire 7 which are connected to the terminal 3, thereby making it possible to make the electronic device 1 compact in size. Moreover, since no locking portion has to be provided in the housing 2, the configuration of the housing 2 is simplified, thereby making it possible to facilitate the fabrication of the housing 2.

In addition, in the embodiment, while the heat-generating element contact portion 31 is described as including the contact portion 31*a*, the configuration of the heat-generating element contact portion 31 is arbitrary. In addition, the substrate connecting portion 34 may extend in the horizontal direction continuously with the heat-generating element contact portion 31 and the wire connecting portion 32 with no space 3A provided between the heat-generating element contact portion 31 and the wire connecting portion 32. Additionally, no guide portion 32*b* may be provided on the wire connecting portion 32.

While the guide recess portions 23 are formed into the U-like shape, guide portions 23 may be formed by ribs. Additionally, either of the substrate 4 and the electric wire 7 may be connected first to the terminal 3. In addition, in the embodiment, while the locking portion is described as being made up of the locking hole 211 and the locked portion 33 as being made up of the flat plate-like projection, the locking portion may be formed by a groove, and the locked portion 33 by an elongated projection. According to this configuration, too, the movement of the locked portion 33 can be restricted by the locking portion, whereby the same function and advantage as those of the embodiment can be obtained.

In addition, the locking portion may be made up of an elongated projection or a projection, and the locked portion may be made up of a groove or a hole. In the embodiment, while the electric wire 7 is described as being press fitted in the terminal 3, a configuration may be adopted in which the electric wire 7 is connected to the terminal 3 by a connector.

According to the invention, the terminals can be mounted in the housing by locking the locked portions in the locking portions, and therefore, the housing and the terminals can be formed separately. In addition, the electric wires are connected to the wire connecting portions from the opposite direction to the connecting direction of the substrate, and therefore, a reduction in height of the accommodation space of the electric wire connected to the terminal can be realized.

What is claimed is:

1. A terminal mounting construction, comprising;

a housing configured to accommodate a substrate and including a locking portion;

a heat-generating element contact portion in contact with a power transistor for dissipating heat;

a terminal configured to connect the substrate accommodated in the housing to an electric wire, wherein the terminal includes:

a conductive portion configured to be connected to a pattern on the substrate;

a substrate connecting terminal portion configured to hold the substrate together with the conductive portion in a state where the substrate is inserted between the conductive portion and the substrate connecting terminal portion;

a wire connecting portion configured to be connected to the electric wire from an opposite direction to an inserting direction in which the substrate is inserted between the conductive portion and the substrate connecting terminal portion; and a locked portion configured to be locked in the locking portion, and wherein the housing includes an accommodating portion configured to accommodate the substrate connecting terminal portion so as to receive an end face of the substrate connecting terminal portion which faces to follow the opposite direction.

2. The terminal mounting construction as set forth in claim 1, wherein the locking portion includes at least one of a groove and hole formed in the housing, and the locked portion includes a projection to be inserted into at least one of the groove and the hole.

3. The terminal mounting construction as set forth in claim 1, wherein a plurality of terminals like the terminal are aligned so that inserting directions of the substrate for each of the terminals are same direction, and the housing includes a guide portion configured to guide the substrate to be inserted into the housing.

4. An electronic device, comprising:

a housing accommodating a substrate;

a cover accommodating the housing and including a locking portion;

a holder, configured to hold a plurality of electric wires which are to be connected to the substrate, and mounted in an opening portion at one end of the cover;

a heat-generating element contact portion in contact with a power transistor for dissipating heat; and a plurality of terminals, disposed to align along the opening portion at the one end of the cover, configured to connect the electric wires to the substrate, wherein each of the terminals includes:

a conductive portion connected to a pattern on the substrate;

a substrate connecting terminal portion holding the substrate together with the conductive portion in a state where the substrate is inserted between the conductive portion and the substrate connecting terminal portion;

a wire connecting portion configured to be respectively connected to the electric wires from an opposite direction to an inserting direction in which the substrate is inserted between the conductive portion and the substrate connecting terminal portion; and a locked portion locked in the locking portion, wherein the wire connecting portion oriented towards an outside of the opening portion at the one end, and wherein the holder is brought into a removable engagement with the cover by an engagement portion.

* * * * *